(12) United States Patent
Miyauchi et al.

(10) Patent No.: US 6,570,691 B1
(45) Date of Patent: *May 27, 2003

(54) OPTICAL TRANSMISSION SYSTEM USING IN-LINE AMPLIFIERS

(75) Inventors: Akira Miyauchi, Kawasaki (JP); Kazuo Yamane, Kawasaki (JP); Yumiko Kawasaki, Kawasaki (JP); Satoru Okano, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/929,090

(22) Filed: Sep. 15, 1997

(30) Foreign Application Priority Data

Feb. 27, 1997 (JP) .............................................. 9-044407

(51) Int. Cl.⁷ .............................................. H04B 10/00
(52) U.S. Cl. ........................ 359/161; 359/173; 359/174; 359/179
(58) Field of Search ................................ 359/161, 173, 359/179, 174

(56) References Cited

U.S. PATENT DOCUMENTS

| | | | |
|---|---|---|---|
| 5,074,631 A | 12/1991 | Hamano et al. | |
| 5,113,278 A | 5/1992 | Degura et al. | |
| 5,170,274 A | 12/1992 | Kuwata et al. | |
| 5,303,079 A | 4/1994 | Gnauck et al. | |
| 5,343,322 A | 8/1994 | Pirio et al. | |
| 5,355,240 A | 10/1994 | Prigent et al. | |
| 5,361,319 A | 11/1994 | Antos et al. | |
| 5,373,382 A | 12/1994 | Pirio et al. | |
| 5,453,868 A | 9/1995 | Blauvelt et al. | |
| 5,574,590 A | 11/1996 | Edagawa et al. | |
| 5,606,445 A | * 2/1997 | Kikuchi et al. | 359/161 |
| 5,612,808 A | 3/1997 | Audouin et al. | |
| 5,717,510 A | 2/1998 | Ishikawa et al. | |
| 5,805,321 A | 9/1998 | Ooi et al. | |
| 5,815,294 A | * 9/1998 | Ishikawa et al. | 359/110 |
| 5,877,879 A | * 3/1999 | Naito | 359/133 |
| 5,877,881 A | * 3/1999 | Miyauchi et al. | 359/161 |
| 6,005,699 A | * 12/1999 | Tomooka et al. | 359/118 |
| 6,137,604 A | * 10/2000 | Bergano | 359/124 |
| 6,320,687 B1 | * 11/2001 | Ishikawa | 359/161 |

FOREIGN PATENT DOCUMENTS

| | | |
|---|---|---|
| EP | 0575881 A1 | 12/1993 |
| EP | 590633 A1 | 4/1994 |

(List continued on next page.)

OTHER PUBLICATIONS

George Ishikawa, et al., "10–Gb/s Repeaterless Transmission Using Standard Single–Mode Fiber with Pre–Chirping and Dispersion Compensation Techniques" IEICE Transactions on Electronics, Tokyo, Japan, pp. 43–48, Jan. 1995, No. 1.

(List continued on next page.)

Primary Examiner—Leslie Pascal
Assistant Examiner—Hanh Phan
(74) Attorney, Agent, or Firm—Staas & Halsey LLP

(57) ABSTRACT

In a system connecting a transmitter and a receiver using transmission paths and repeaters (in-line amplifiers), red chirping whose a parameter is positive is performed for an optical signal on a transmitting side. Each of the repeaters includes a dispersion-compensator for compensating the amount of dispersion on a preceding transmission path. The amount of dispersion compensation of the dispersion-compensator included in the transmitter is made constant. The dispersion-compensator included in the receiver is arranged in order to compensate the amount of dispersion on a preceding transmission path. A spread of a pulse width on a transmission path can be efficiently compensated by using the compensation capability of the dispersion-compensators and the red chirping on the transmitting side.

20 Claims, 10 Drawing Sheets

FOREIGN PATENT DOCUMENTS

| | | |
|---|---|---|
| EP | 0 700 178 A2 | 3/1996 |
| EP | 0732819 A2 | 9/1996 |
| EP | 0802642 A2 | 10/1997 |
| FR | 2 685 834 | 7/1993 |
| GB | 2299473 A | 10/1996 |
| JP | 7-74699 | 3/1995 |
| JP | 9-46318 | 2/1997 |
| JP | 09-284218 | 10/1997 |

OTHER PUBLICATIONS

Bob Jopson, et al., "Dispersion Compensation for Optical Fiber Systems", IEEE Communications Magazine, New York, U.S., pp. 96–102, Jun., 1995, No. 6.

Francois Ouellette et al., "All–Fiber Devices for Chromatic Dispersion Compensation Based on Chirped Distributed Resonant Coupling", *Journal of Lightwave Tech.*, vol. 12, No. 10, Oct. 1994.

Bob Jopson et al., "Dispersion Compensation for Optical Fiber Systems", *IEEE Communication Magazine*, Jun., 1995.

U.S. patent application Ser. No. 08/752,516, A. Miyauchi et al., filed Nov. 20, 1996, Fujitsu Limited.

U.S. patent application Ser. No. 08/922,677, A. Miyauchi et al., filed Aug. 29, 1997, Fujitsu Limited.

* cited by examiner

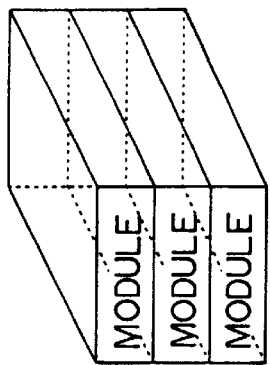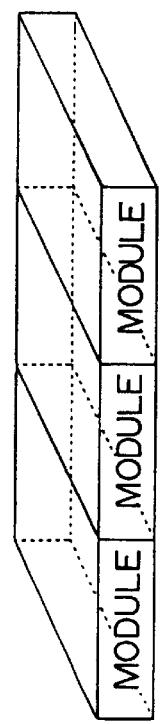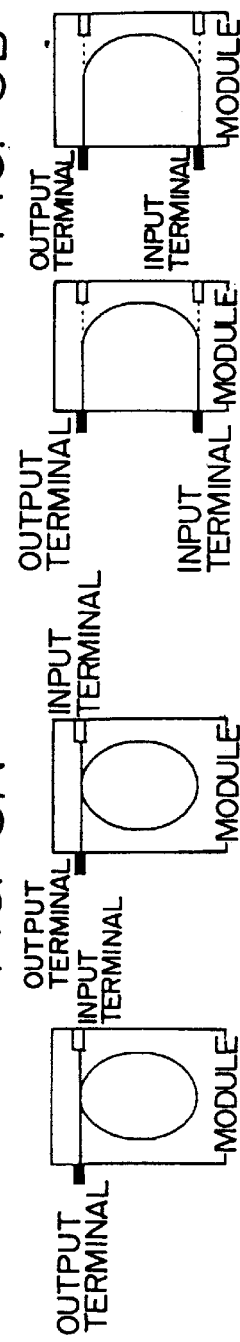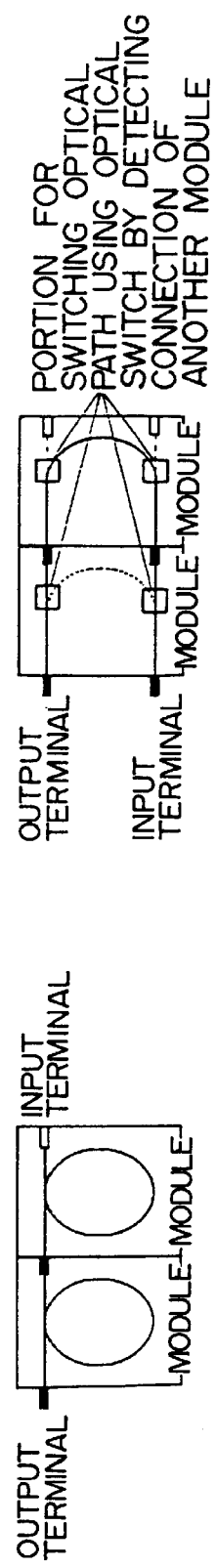

OPTICAL TRANSMISSION SYSTEM USING IN-LINE AMPLIFIERS

BACKGROUND OF THE INVENTION

1. Field of the Invention

The present invention relates to an optical transmission system using fibers, and more particularly to an optical transmission system using in-line amplifiers.

2. Description of the Related Art

An optical transmission system is now being developed with increase capacity an extend a span of transmission. An increase of a bit rate and wavelength division multiplexing system are now being discussed so as to increase capacity. In the meantime, an optical amplifier has been introduced so as to extend the span of transmission. The types of optical amplifiers include a post-amplifier (for strengthening output of transmission power), a pre-amplifier (for increasing the sensitivity of reception power), and a repeater (in-line amplifier). The optical amplifier is currently under development at a production level. The introduction of the optical amplifier allows the difference between optical intensities at transmission and reception to be extended, and an allowable loss in the fiber is increased.

A system configuration using a post-amplifier and a pre-amplifier has been put into practical use. Additionally, the in-line amplifier is under development in order to extend the reproduction relay interval. Here, the in-line amplifier is a repeater which amplifies an optical signal without converting it into an electric signal, and transmits the amplified signal.

The system using in-line amplifiers, however, poses a new problem where amplified spontaneous emission lights from a plurality of amplifiers due to the connection of the plurality of amplifiers, are accumulated, and the S/N ratio is lowered. The lowering of the S/N ratio leads to the degradation of a minimum reception power of a receiver. To obtain a predetermined system gain in consideration of this degradation, transmission power output must be strong thereby a lower limit value of the transmission power is determined. Furthermore, if the transmission power output is stronger than a threshold +8 dBm for a dispersion shifted fiber, and 10 dBm or more for a single mode fiber, although it depends on the length of a transmission path or a wavelength), the waveform is significantly degraded due to the non-linear effect of a fiber. One type of wavelength degradation is an optical Kerr effect (refractive index changes depending on an optical intensity). This is a phenomenon where a frequency (wavelength) shift occurs at the rising and falling edges of an optical signal pulse (SPM: Self- Phase Modulation). Even if the width of an optical wavelength is narrow before transmission, the width of the wavelength increases, and at the same time, a reception waveform significantly changes due to the influence of fiber dispersion. The upper limit of optical transmission power is determined in consideration of such an influence.

Fiber dispersion means that the speed of light propagating on a fiber depends on its wavelength. An optical pulse having a certain wavelength width is widened or compressed after fiber propagation. This effect is referred to as fiber chromatic dispersion. Accordingly, a reception waveform in an optical transmission system after fiber propagation varies depending on chromatic dispersion, and a transmission error will occur depending on the degree of dispersion. Therefore, fiber dispersion imposes a restriction on the transmission distance.

With a system using an in-line amplifier which amplifies an optical signal without conversion, such non-linear effect and dispersion are accumulated while the optical signal travels. Accordingly, it becomes quite impossible to properly receive the optical signal on a receiving side unless suitable compensation is made.

In the meantime, a system implemented by combining blue chirping on a transmitting side and dispersion compensation in repeaters and a receiver was conventionally proposed.

FIG. 1 is a schematic diagram showing a combination of conventional pre-chirping and dispersion compensators.

In this figure, a transmitter 1000 and a receiver 1010 are connected by transmission paths 1003, 1006 and 1009, and repeaters 1004 and 1007. The transmitter 1000 is composed of an E/O 1001, for converting an electric signal into an optical signal, and a post-amplifier 1002. The transmitter 1000 performs blue-chirping on the optical signal, and transmits the signal. The transmitted optical signal travels along the transmission path 1003 and enters the repeater 1004. The repeater 1004 amplifies the optical signal, and performs dispersion compensation using the dispersion compensator 1005. The amount of dispersion compensation is a constant value. The optical signal, which is further amplified and dispersion-compensated, passes along the transmission path 1006 and enters the repeater 1007. The repeater 1007 also amplifies the signal, performs dispersion compensation and transmits the signal on the transmission path 1009. The optical signal passes through repeaters whose number is predetermined, until it reaches the receiver 1010. The receiver 1010 amplifies the received optical signal using a pre-amplifier, performs dispersion compensation using a dispersion-compensator 1012, inputs the signal to an O/E 1013 in order to convert the optical signal into an electric signal, and extracts necessary data.

That is, the conventional combination is implemented by combining blue chirping (especially, chirping parameter $\alpha = -1$) as the pre-chirping, and compensation by the dispersion-compensators arranged in in-line amplifiers and the receiver (between the pre-amplifier and the O/E). If the blue-chirping is performed in a fiber of + dispersion, the output pulse is compressed due to the characteristics of the fiber of + dispersion, and the chirping. As a result, a transmission distance is made relatively longer. Especially, in a system which does not use optical amplifiers, an optical signal having the wavelength of 1.5 $\mu$m is more effective when it travels along a single mode fiber (1.3$\mu$zero-dispersion wavelength). Accordingly, dispersion compensation implemented by combining the pre-chirping and the succeeding compensation was considered also to be effective in a system using optical amplifiers. If the amount of dispersion compensation is set in order to keep a residual dispersion value (obtained by subtracting the amount of dispersion compensation from a total amount of dispersion of a transmission fiber) constant, a stable transmission characteristic can be obtained.

However, if output of the transmission power is increased by introducing optical amplifiers according to this method, the influence of the non-linear effect of an optical fiber remarkably appears. The influence of the non-linear effect is equivalent to the characteristic of blue chirping. The pulse width of the transmission waveform is narrowed due to the influence of the pre-chirping at the transmitter and the non-linear effect of the optical fiber. As a result, the influence of the non-linear effect remarkably appears, and the waveform is significantly changed for the dispersion.

The problems posed by the method for performing blue-chirping at the time of transmission are listed below.
1) Output of transmission power cannot be increased.
2) Dispersion-compensation on a transmitting side is ineffective.
3) The dispersion-compensation is performed in in-line amplifiers and on a receiving side due to the ineffectivity on the transmitting side in consideration with 2). Accordingly, the losses of dispersion-compensators become larger, and the tolerance of the losses becomes difficult as transmission distance is extended. Lowering the level of an optical input to the O/E leads to degradation of reception sensitivity, and this imposes a limitation. Furthermore, optical input power may sometimes have an upper limit depending on the dispersion-compensator to be used.
4) The tolerance of the amount of dispersion-compensation which can ensure the transmission characteristic is small.
5) The number of types of different device increases when the dispersion-compensator are prepared according to a transmission distance due to the small tolerance as a result of 4).

SUMMARY OF THE INVENTION

The object of the present invention is to provide a technology which can compensate for transmission degradation especially due to fiber Dispersion, and ensure a good transmission characteristic for a longer distance, in an optical in-line amplifier system.

The optical transmission system according to the present invention assumes the use of repeaters (in-line amplifiers). It comprises a transmitter, repeaters, a receiver and transmission paths for interconnecting these modules. The present invention is characterized in that the transmitter performs chirping whose α parameter is positive for an optical signal and each of the repeaters and the receiver include a dispersion-compensator having an amount of dispersion compensation to compensate for dispersion from a transmission path preceding each of the repeaters and the receiver.

Since the non-linear effect that the optical signal receives on the transmission path corresponds to the blue chirping, this effect can be compensated for by performing red chirping whose the parameter is positive on the transmitting side. This leads to the effect of preventing the waveform of the optical signal from being degraded.

Furthermore, degradation of the optical signal can be prevented more effectively by setting the amount of dispersion compensation in order to compensate for the dispersion from a preceding transmission path, on each of the repeaters or the receiver.

With the above described configuration, an optical signal can be transmitted by performing red chirping to compensate for the non-linear effect in order to prevent a waveform from being degraded even if an optical output power is increase on the transmitting side.

Additionally, since the amount of dispersion compensation in a repeater or a receiver can be achieved from a combination of unit modules, implementation as a product is relatively easy.

BRIEF DESCRIPTION OF THE DRAWINGS

FIGS. 8A through 8D are schematic diagrams explaining unit modules of a dispersion-compensator;

DESCRIPTION OF THE PREFERRED EMBODIMENTS

Figure 1:
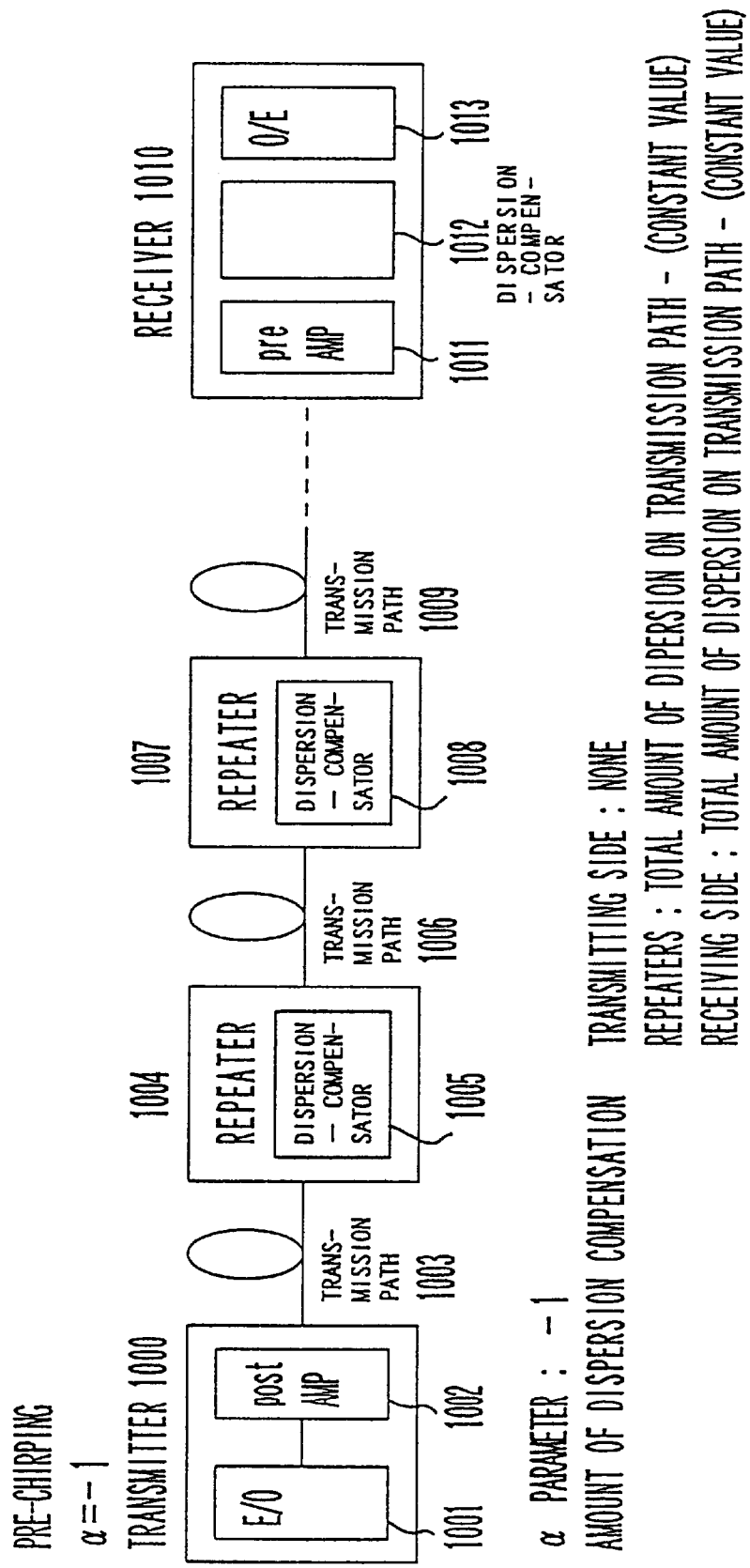
FIG. 1 is a schematic diagram showing a combination of a conventional pre-chirping and dispersion-compensators.
Figure 2:
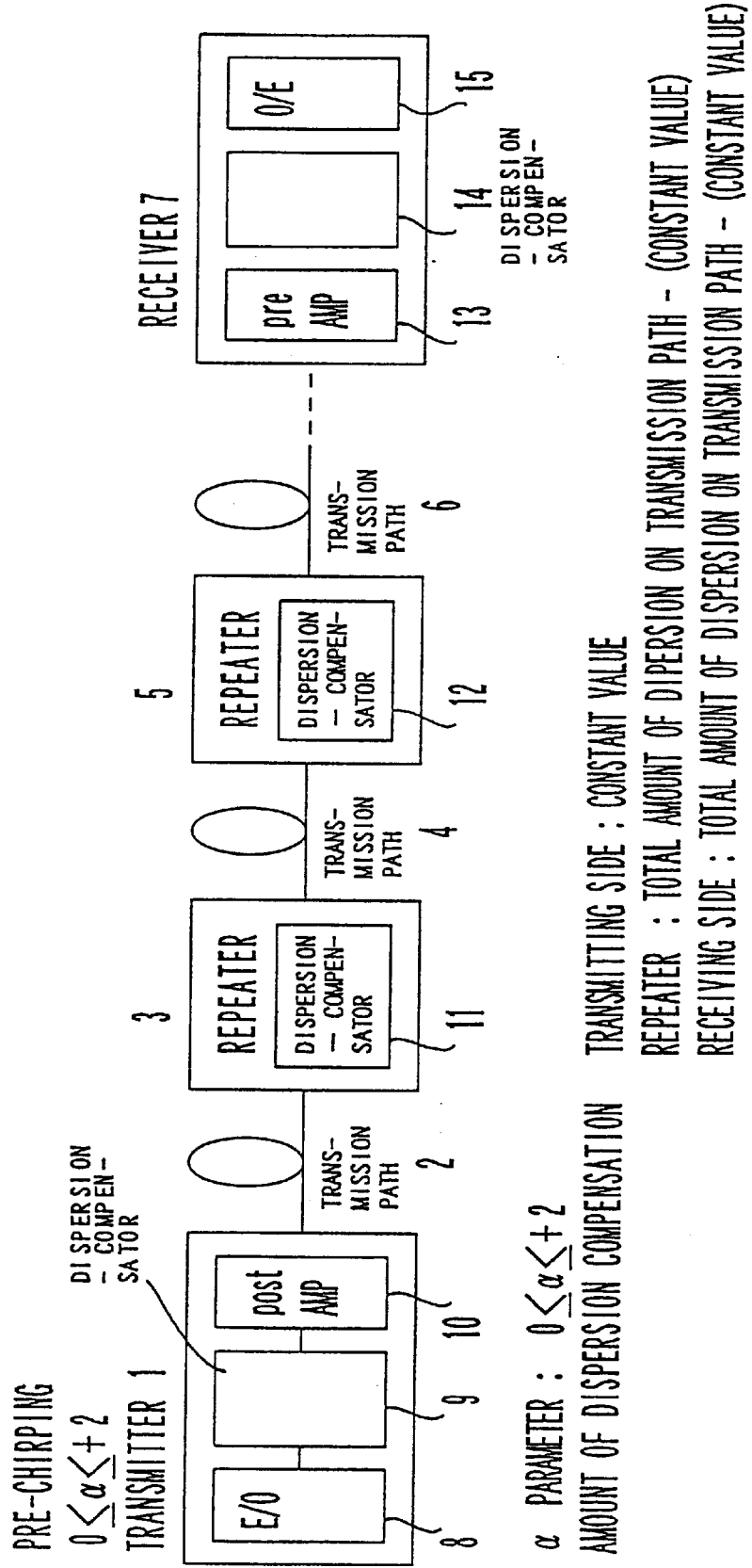
FIG. 2 is a schematic diagram showing the basic configuration of an embodiment according to the present invention.

FIG. 2 is a schematic diagram showing the basic configuration of an optical transmission system according to an embodiment of the present invention.

In this figure, a transmitter 1 and a receiver 7 are connected by transmission paths 2, 4, 6, . . . and repeaters 3, 5, . . . . The transmitter 1 is composed of an E/O (Electric-to-optical signal converter) 8, a dispersion-compensator 9 and a post-amplifier 10. The E/O 8 is intended to convert an electric signal into an optical signal. The dispersion-compensator is intended to perform a predetermined amount of dispersion compensation on the side of the transmitter 1. The post-amplifier 10 is intended to amplify an optical output in order to allow the optical signal to be transmitted farther along a transmission path. In addition, red chirping whose α parameter ranges between 0 and +2 is performed on the side of the transmitter 1, according to the present invention. The amount of dispersion compensation of each of the dispersion-compensators 11 and 12 included in the repeaters 3 or 5 is adjusted in order to compensate for the dispersion from the preceding transmission path (transmission path from the preceding repeater to the local repeater: the length of a transmission path between repeaters is referred to as a 1R transmission distance or a 1R interval). That is, the dispersion-compensator 11 possesses the amount of dispersion compensation necessary for compensating the dispersion from the transmission path 2, while the dispersion-compensator 12 possesses the amount of dispersion compensation necessary for compensating the dispersion from the transmission path 4. Also dispersion-compensators arranged in other repeaters, (not shown in this figure) are configured so that they possess the amount of dispersion compensation necessary for compensating the dispersion from a preceding transmission path. The receiver 7 is composed of a pre-amplifier 13, a dispersion-compensator 14, and an O/E (optical-to-electric signal converter) 15. The pre-amplifier 13 is intended to amplify a transmitted optical signal so that it can be detected with ease. The dispersion-compensator 14 is arranged in order to compensate for the dispersion from the transmission path preceding the receiver 7. The O/E 15 is intended to convert an optical signal into an electric signal, and output the converted signal to a device for extracting data.

A transmitting side narrows the pulse width of the signal using chirping and dispersion-compensation, and outputs the signal having a narrow pulse width to a transmission path. (fiber) The signal is influenced by the non-linear effect of the fiber (narrowing of the pulse width) and the dispersion of the fiber (widening of the pulse width). Since the effects are cancelled out by each other only a slight waveform change is made from the dispersion. The degradation caused by the dispersion is improved by performing the dispersion compensation in each of the in-line amplifiers and on the receiving side. That is, the waveform is improved (the pulse width is narrowed), and input to the receiver.

One advantage of this compensation method is that the dispersion compensation can be made effective on the transmitting side. This is required for narrowing the pulse width of a waveform to be transmitted. By narrowing the pulse width and transmitting the signal having a narrowed pulse width to a transmission path, the amount of inter-symbol interference on one side of a logical value "0" is reduced. As a result, an improved transmission characteristic can be obtained. That is, the optimization of the narrowing of the waveform becomes vital, and the determination of the amounts of transmission chirping and dispersion compensation on the transmitting side depends on how to optimize the pulse width of the waveform.

Another advantage of this method is that the tolerance of the amount of dispersion compensation, which secures the desired transmission characteristic, can be increased. Since the pre-chirping of a transmitter is the red chirping, the pulse width of a waveform is widened at the time of propagation along an optical fiber of + dispersion. In the meantime, because the influence of the non-linear effect in the optical fiber is equivalent to the characteristic of the blue chirping, the pulse width is narrowed. That is, the influence of the non-linear effect is cancelled out by the pre-chirping of the transmitter. As a result, only a slight waveform change is made from the dispersion. Accordingly, the range of the transmission distance which can satisfy a required transmission characteristic is widened for a set amount of dispersion compensation. This leads to a reduction in the number of types menus of a dispersion-compensators. That is, the most important point of this method is to how to set the α parameter.

In the system shown in FIG. 2, a transmission pulse is narrowed by combining the characteristics of the chirping parameter and the dispersion-compensator on the transmitting side, and is output to the transmission path. Furthermore, the characteristic of the chirping at the transmitter is cancelled out by the characteristic of the chirping which occurs due to the influence of the non-linear effect. On the receiving side, the waveform, degraded due to the dispersion, is compensated (narrowing of the pulse width) by combining the characteristics of the chirping parameter and the dispersion-compensator.

Figure 3A:
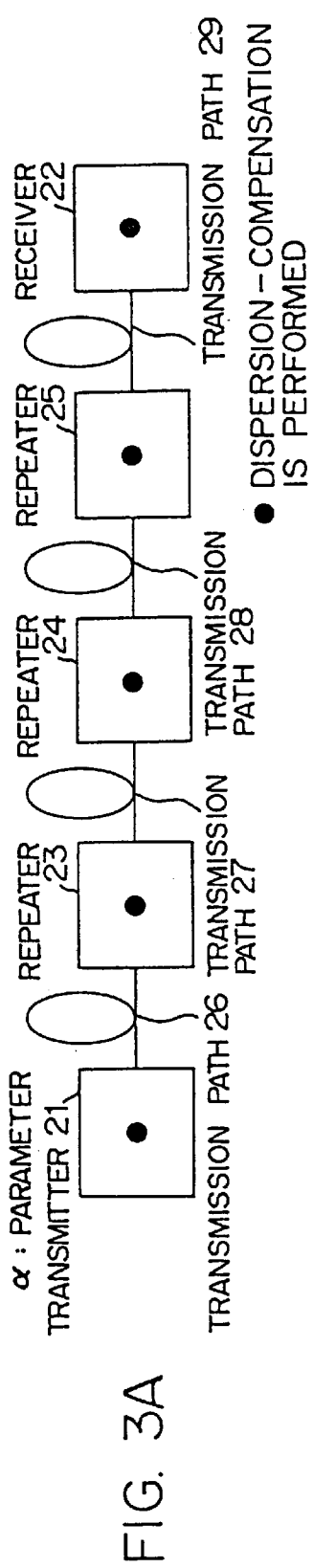
FIGS. 3A and 3B are schematic diagrams showing the dependency of a 1R transmittable distance range corresponding to a change of an a parameter.
Figure 3B:
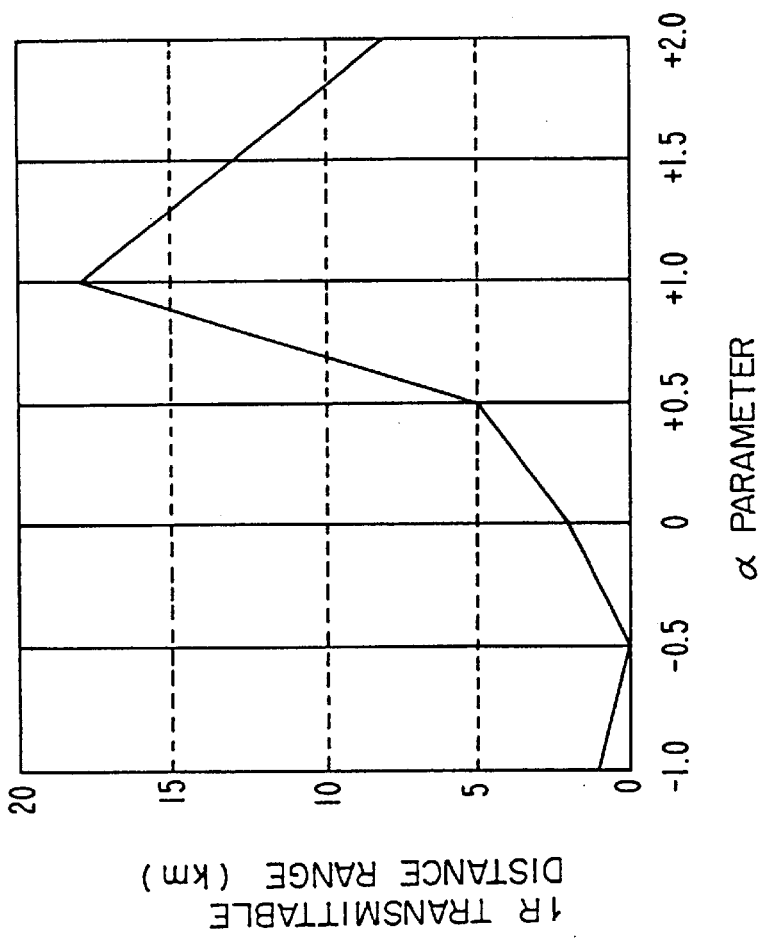

FIGS. 3A and 3B are schematic diagrams showing the dependency of the range of a 1R transmittable distance on the α parameter.

These schematic diagrams show the range of the 1R transmittable distance range which can satisfy a required transmission characteristic for each α parameter under the predetermined conditions, such as the amount of dispersion compensation and the number of periods. As shown in FIG. 3A, three repeaters 23, 24 and 25 are arranged between a transmitter 21 and a receiver 22. These repeaters are connected by the transmission paths 26, 27, 28 and 29. FIG. 3B shows, for each α parameter, the range in which a required transmission characteristic can be obtained, when the amount of dispersion compensation of each of the transmitter 21, receiver 22 and the repeaters 23, 24 and 25 is set to a constant value, and the 1R transmission interval is assumed to be a parameter.

As shown in FIG. 3B, a wide range of the 1R transmission distance can be secured if the value of the α parameter is positive. Actually, the 1R transmission distance is short when the value of the α parameter is close to "0". To cancel out the non-linear effect occurring on a transmission path by making an optical output stronger, it is effective if the α parameter is set to a positive value. Accordingly, the α parameter adopts the positive value. Furthermore, it is estimated from the result of FIG. 3B that the value of the α parameter in the neighborhood of "+1" is best. However, since this figure assumes that the transmission output is +14 dBm, the result is obtained based on this assumption. If the transmission output is changed, the optimum value of the α parameter is considered to shift.

The transmission output in an in-line amplifier system is currently assumed to be of the order of +5 to +17 dBm. Therefore, the change of the order of –9 to +3 dB for +14 dBm is considered. The amount of a shift of frequency at a light source is proportional to the α parameter, while the amount of a shift of frequency due to the non-linear effect of a transmission path fiber is proportional to a transmission output when the transmission distance is fixed. Therefore, the optimum value of the α parameter is considered to vary in proportion to the amount of change in the transmission output according to the present invention, where transmitter chirping cancels the non-linear effect.

Consequently, the optimum value of the α parameter is expected to change with power change of, from the optimum value for the –9 to +3 dB +1, that is, in the range for α from 0.125 to 2. The lower limit, however, is replaced with "0" which is the lowest extreme in consideration of the case in which optical amplifiers are not used, and the transmission output level is low. Finally, the range from 0 to 2 is considered to be an effective range for the α parameter.

Accordingly, the range of the 1R transmittable distance can be secured in a wide range where the value of the α parameter is positive. This allows a reduction of the number types of dispersion-compensators. Accordingly, it is effective that the α parameter is set within the positive range.

With the improvements on the conventional method summarized according to the above description, the following points can be cited:

1) The tolerance of the amount of dispersion compensation, which can secure a transmission characteristic, increases.
2) The number of device types can be reduced when types of dispersion-compensator is set according to the transmission distance, as a result of 1).

Figure 4A:
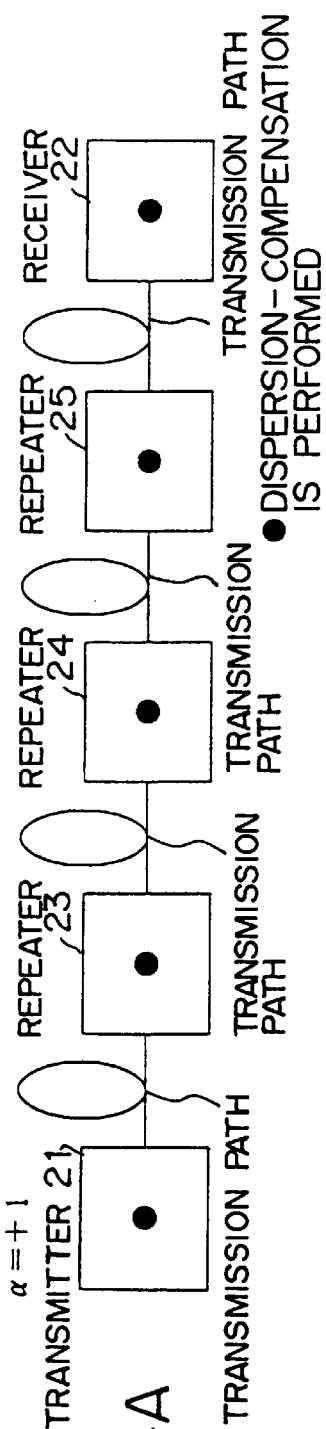
FIGS. 4A and 4B exemplify a menu setting at the time of propagation along a single mode fiber.
Figure 4B:
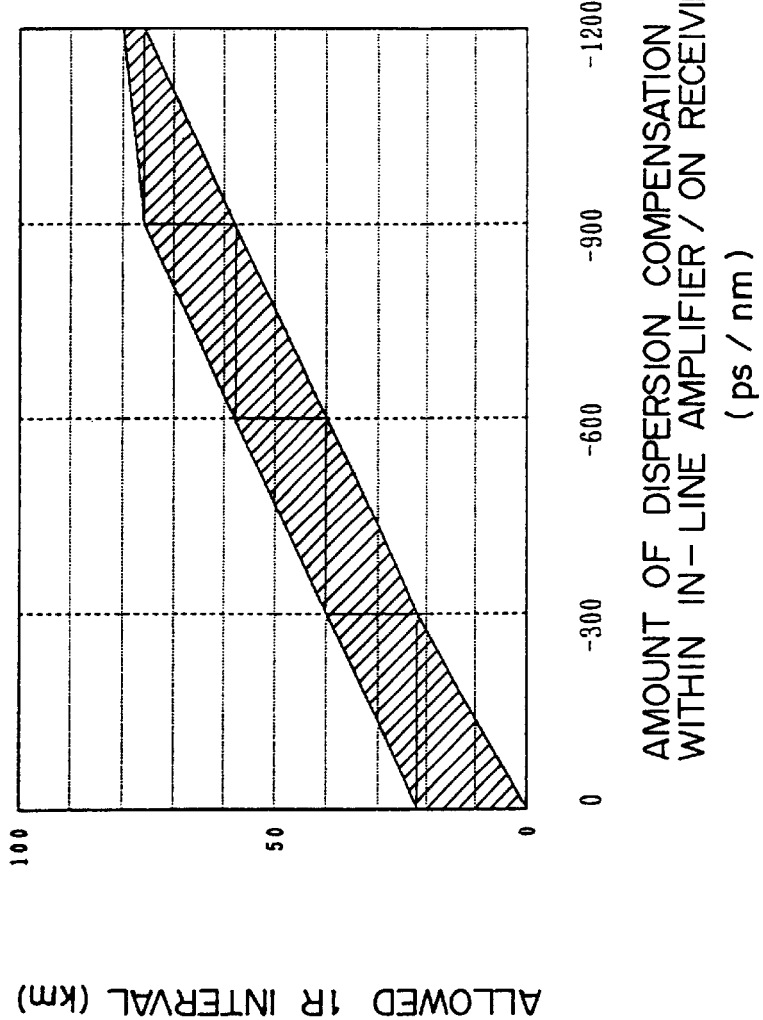

FIGS. 4A and 4B exemplify a menu setting at the time of propagation along a single mode fiber.

As shown in FIG. 4A, three repeaters are set, and the amount of compensation is set so that the dispersion compensation can be made for a 1R interval range from 0 to 80 km. A dispersion-compensator is arranged in each of the transmitter 21, receiver 22, and the repeaters 23, 24 and 25. The amount of dispersion compensation on the transmitting side is assumed to be –600 ps/nm, and the amount of dispersion compensation within in-line amplifiers/on a receiving side is reviewed.

FIG. 4B shows the result of the-review of the required compensation at in-line amplifiers/on the receiving side.

The shaded portion in FIG. 4B represents an allowable 1R interval for each amount of dispersion compensation. As shown in FIG. 4B, the range from 0 to approximately 22 km can be secured as a 1R transmission distance between in-line amplifiers, or between an in-line amplifier and a receiver, if the amount of dispersion compensation is 0 ps/nm. To secure the range of the 1R transmission distance exceeding approximately 22 km, it is sufficient that the amount of dispersion compensation within an in-line amplifier or on a receiving side is set to −300 ps/nm. This allows a 1R transmission distance from approximately 22 to 38 km to be covered. Similarly, the dispersion of a transmission path between in-line amplifiers or between an in-line amplifier and a receiver can be compensated by setting the amounts of dispersion compensation to −600 ps/nm for the range from approximately 38 to 58 km, to −900 ps/nm for the range from approximately 58 to 78 km, and to −1200 ps/nm for the range from approximately 78 to 80 km.

As described above, an optical transmission system which uses in-line amplifiers and prevents the waveform of an optical signal from degrading can be implemented by preparing five types 0, −300, −600, −900 and −1200 ps/nm, of dispersion compensation, when the 1R interval is set at a range from 0 to 80 km.

In an actual system, the 1R interval may differ for each interval. Even in such a case, the amount of dispersion compensation can be selected in order to obtain a required transmission characteristic with this method. The present invention is characterized in that the amount of dispersion compensation is set depending on a distance prior to a repeater.

Figure 5:
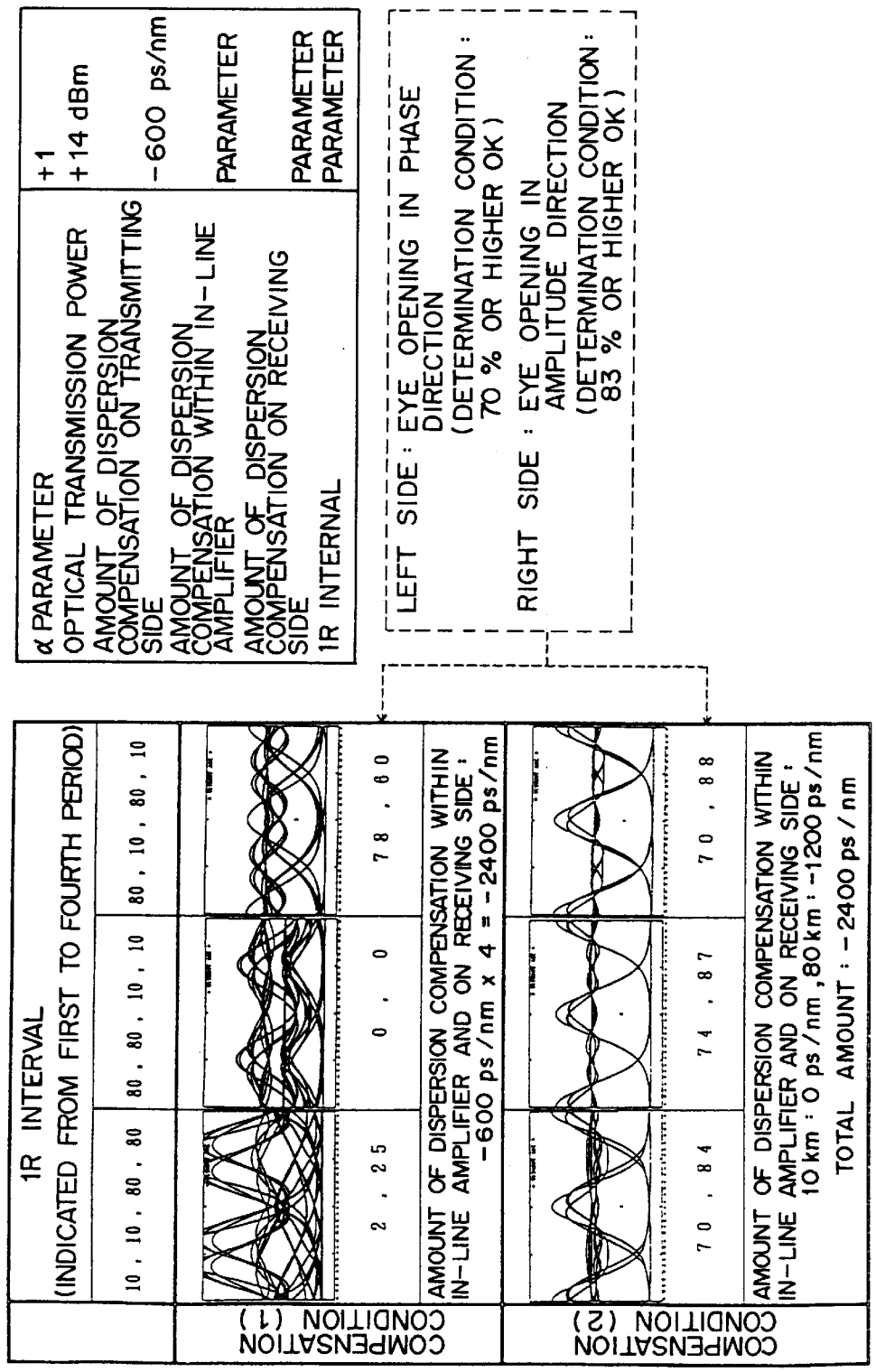
FIG. 5 is a schematic diagram showing a dispersion compensation method and the degradation of a waveform on a receiving side when a 1R interval varies depending on a period at the time of the propagation along a single mode fiber.

FIG. 5 shows the method for compensating dispersion and the degradation of a waveform on a receiving side when a 1R interval differs for each interval of propagation along a single mode fiber.

The amount of dispersion compensation on a transmitting side is assumed to be −600 ps/nm, and two methods for compensating dispersion within in-line amplifiers/on a receiving side are presented. The upper compensation condition (1) is intended for a 3R transmission distance, and the amount of dispersion compensation within in-line amplifiers and on a receiving side is set to an identical value. The lower compensation condition (2) is intended for the 1R transmission distance, and the amounts of dispersion compensation within an in-line amplifier and on a receiving side are separately set. FIG. 5 shows the equalized waveforms of the O/E.

Under the upper compensation condition (1) shown in FIG. 5, the amounts of dispersion compensation within the in-line amplifiers and on a receiving side are set to −600 ps/nm. Judging from the eye patterns obtained for the various patterns of the 1R interval, an eye opening of a certain degree is obtained if the 1R interval is set to 80 and 10 km in turn. However, since almost no opening is obtained in the other cases, it is nearly impossible to properly read the logical values "1" and "0".

In the meantime, under the lower compensation condition (2), the amounts of dispersion compensation within an in-line amplifier and on a receiving side are set to 0 ps/nm if the 1R interval is 10 km, and to −1200 ps/nm if the 1R interval is 80 km, so that the amounts are suitable for the preceding 1R interval. This method for setting dispersion compensation is performed according to the graph shown in FIG. 4B.

By suitably setting the amount of dispersion compensation so as to correspond to a preceding 1R interval, as described above, an eye opening which is wide enough can be obtained as indicated by the lower eye pattern shown in FIG. 5. As a result, the logical values "1" and "0" can be accurately obtained.

Especially, when a short distance of 10 km first exists, the transmission characteristic significantly differs depending on the compensation methods. In this case, a better waveform can be obtained under the (lower) compensation condition (2) rather than the (upper) condition (1). That is, the method for determining the amount of dispersion compensation according to the distance prior to a repeater/receiver is effective.

Figure 6:
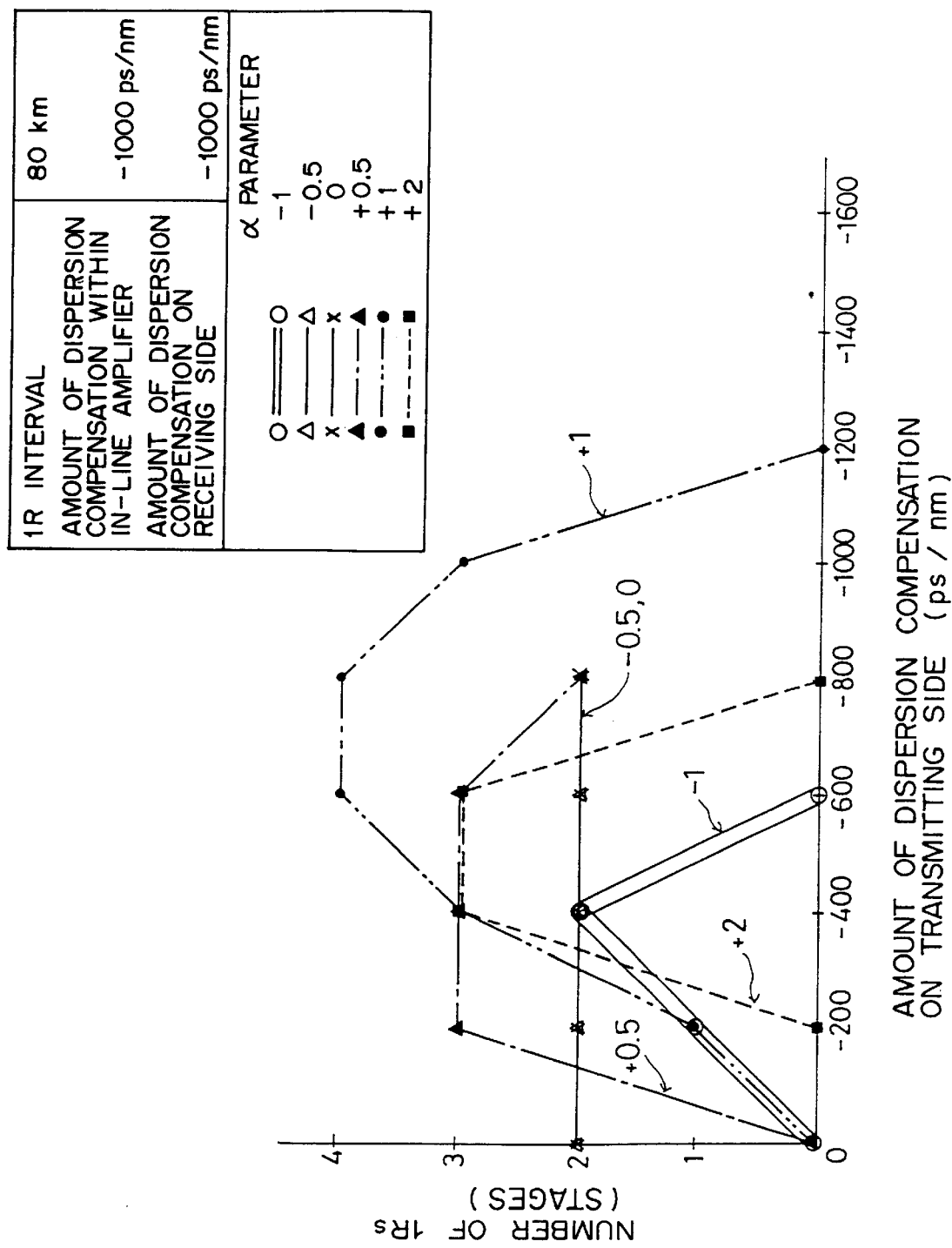
FIG. 6 is a graph showing the number of 1Rs satisfying a transmission characteristic required for an amount of dispersion compensation on a transmitting side, which is obtained for each α parameter.

FIG. 6 is a schematic diagram showing the number of 1Rs, which satisfy a transmission characteristic required for the amount of dispersion compensation on a transmitting side, for each $\alpha$ parameter.

FIG. 6 assumes that the 1R transmission distance is set to 80 km, and the amounts of dispersion compensation within in-line amplifier(s) and on a receiving side are set to −1000 ps/nm. Here, the number of 1Rs is the number of relays using linear repeaters.

It can be seen from FIG. 6 that if the $\alpha$ parameter is negative, a required transmission characteristic can be satisfied for up to only two 1Rs. However, by setting the $\alpha$ parameter positive, this phenomenon can be improved. Especially, if the $\alpha$ parameter is +1, the required transmission characteristic can be obtained for the widest range, and the maximum amount of dispersion compensation on the transmitting side will be −1200 ps/nm.

To obtain the required transmission characteristic means that a waveform of a light pulse signal changes up to 10% in the amplitude direction and up to 30% in the phase direction in comparison with the case in which no influence is given.

That is, it is shown from FIG. 6 that a longer transmission distance can be secured by which a required transmission characteristic can be obtained when the $\alpha$ parameter is positive rather than negative. Especially, the longest transmission distance can be secured if the value of the $\alpha$ parameter is +1.

Note that, however, the value of the $\alpha$ parameter which can obtain the longest transmission distance may vary when the transmission output of an optical signal is changed. This is because the optimum value of the $\alpha$ parameter depends on the optical transmission output. At least, it can be said from this figure that it is better to set the $\alpha$ parameter to a positive value rather than to a negative value.

Figure 7:
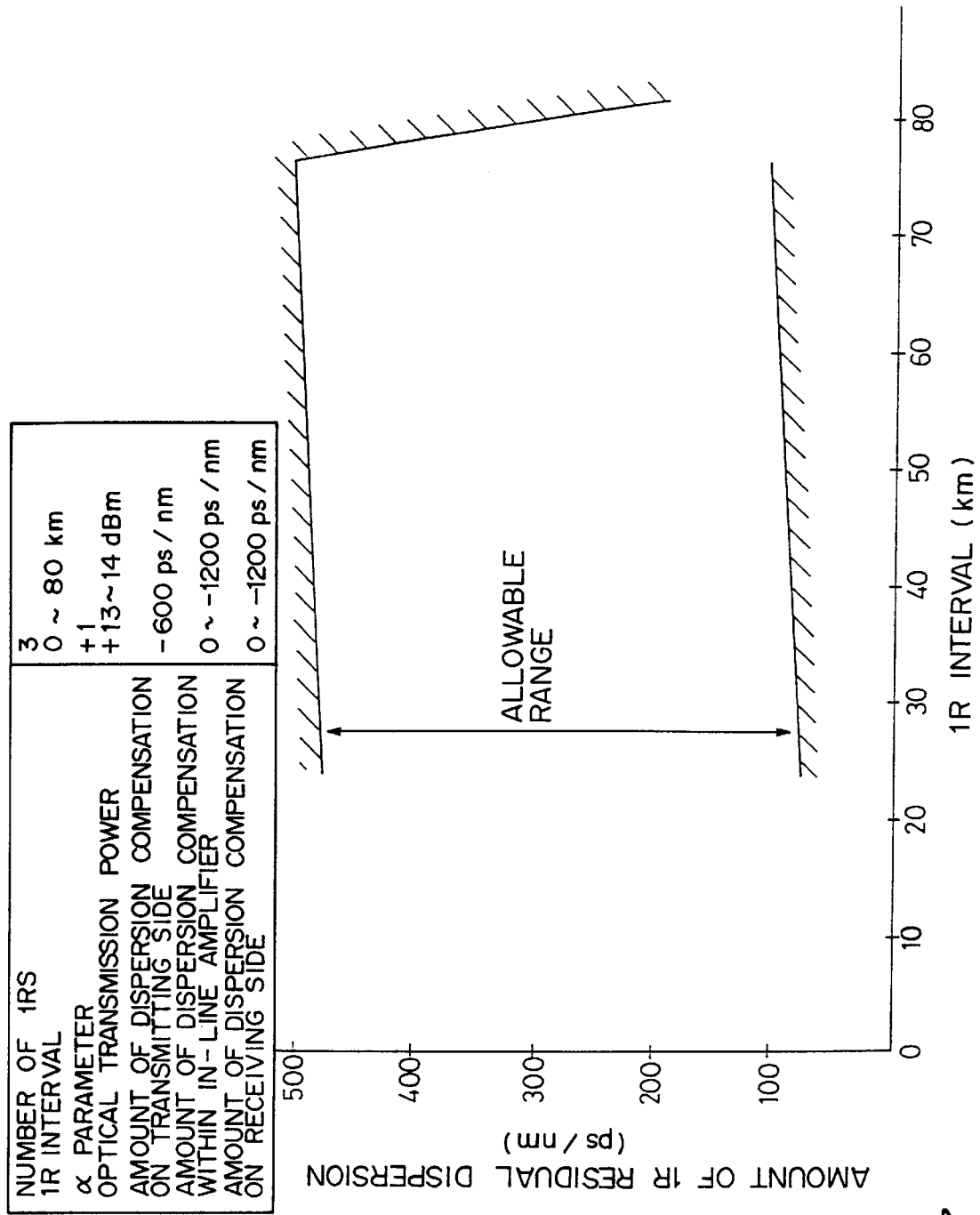
FIG. 7 is a schematic diagram showing the relationship of a 1R interval to an amount of a 1R residual dispersion.

FIG. 7 is a schematic diagram showing the relationship of a 1R interval to an amount of 1R residual dispersion.

This figure assumes that the number of 1Rs (the number of repeaters plus 1, for the receiver) is 3, the value of the $\alpha$ parameter is +1, the optical transmission power is +13 to +14 dBm, the amount of dispersion compensation on a transmitting side is −600 ps/nm, and the amounts of dispersion compensation within in-line amplifiers and on a receiving side are 0 to −1200 ps/nm. The amount of 1R residual dispersion (the amount of residual dispersion at 1R intervals) is examined in the range of the 1R interval from 0 to 80 km based on this assumption.

It can be seen from FIG. 7 that a required transmission characteristic can be obtained by setting the amount of 1R residual dispersion to approximately 100 to 400 ps/nm even if the 1R interval varies. The number of repeaters is 3 in this figure. However, if the number of repeaters is set at 2, a repeater interval is expected to be extended up to 120 km. Therefore, the maximum amount of dispersion compensation on the receiving side is obtained based on the assumption that the repeater interval is 120 km. Assuming that the amount of fiber chromatic dispersion is 20 ps/nm/km in this case, the amount of dispersion of the 1R interval will be 2400 ps/nm. The maximum amount of dispersion compensation on the receiving side can be obtained as being −2300 ps/nm by subtracting the minimum amount of 1R residual dispersion 100 ps/nm from the above described amount.

The above described embodiment assumes a transmission speed which is too great to ignore the non-linear effect that an optical signal undergoes on a transmission path. For example, the speed is 10 Gbps.

According to any of the above described embodiments, a dispersion compensator prepared for a receiving side can be combined with a module having the same amount of dispersion compensation. For example, the amounts of dispersion compensation within in-line amplifier(s) and on a receiving side are a multiple of −300 ps/nm such as 0, −300, −600, −900 and −1200 ps/nm in the compensation setting graph shown in FIG. 4B. Referring to FIG. 4B, such amounts of dispersion compensation can cover a 1R interval of up to 80 km. Accordingly, a module having the amount of dispersion compensation −300 ps/nm may be used as a unit for the dispensation compensation, and combined with other units so as to obtain a required amount of dispersion compensation.

That is, the amount of dispersion compensation basically must be changed according to a transmission distance (the amount of dispersion which occurs on a transmission path). There is a conventional method for measuring the amount of dispersion on each transmission path, and setting the amount of dispersion compensation in order to keep the amount of residual dispersion constant. With this method, however, innumerable types of dispersion-compensators, which must be custom-built, are required. As a result, an economic problem occurs when this method is put into practice. There is another conventional method for appropriately dividing a transmission distance, determining the amount of dispersion compensation for each divided interval, and setting menus of a dispersion-compensator. If the number of menus is large, however, the number of types of peripheral parts increases. That is, it is not economical.

According to the present invention, a minimum unit of the amount of dispersion compensation (for example, −300 ps/nm) is set, and only one type is used as the basic unit of dispersion compensation. Modules respectively having the amount of dispersion compensation of the minimum unit are connected in order to realize the required amount of dispersion compensation according to the transmission distance. If such a dispersion-compensator is used, it is not necessary to change the dispersion-compensator itself, even if a transmission distance is changed due to a moving of equipment. It is sufficient only to add or remove a module (or modules). Additionally, since the number of types of modules is only 1, is very economical to implement different system.

With the above described method, however, there is a possibility that the transmission characteristic cannot be secured depending on various difficulties such as non-uniformity of fibers, a change of an output power, etc. It is effective that a dispersion-compensating module for correction (such as a module having the amount of dispersion compensation −100 ps/nm) is prepared in order to cope with the case in which the above described problems should happen, and is added to the other modules in order to make a subtle adjustment.

There is also the case in which the input/output level of a dispersion-compensator is made constant, and the loss of the dispersion-compensator must be within a predetermined range regardless of the amount of dispersion compensation. For example, there may be restrictions imposed by the input levels of an O/E, a post-amplifier, etc. In such a case, the loss of the dispersion-compensator will be set within the required range by additionally using an optical attenuator. Alternatively, it is possible to cause a loss with an intentional shift of optical axes at the time of a fiber splice. The loss is thus set even if the amount of dispersion compensation is changed. Setting prevents a succeeding device from being influenced.

As a method for connecting modules, a connection by a splice (fusion of fibers), a connection using a connector etc., can be cited. The module itself may be configured so that it can be attached/detached.

FIGS. 8A through 8D are schematic diagrams explaining modules of a dispersion-compensator. FIGS. 8A and 8B show variations of an arrangement of modules. FIG. 8A shows a variation in which modules are arranged in series or side by side, while FIG. 8B shows a variation in which modules are stacked.

FIGS. 8C and 8D show a connection method in the above cases. FIG. 8C shows a method for arranging one of the input and output terminals on one of the opposing sides, and arranging the other of the two terminals on the other of the two sides. FIG. 8D shows the structure in which both input and output terminals are arranged on one side. In this case, the module includes a switching circuit, which detects the insertion of a terminal when another module is connected and opens a and closed portion to opposing terminals, so that the modules become connected.

Figure 9A:
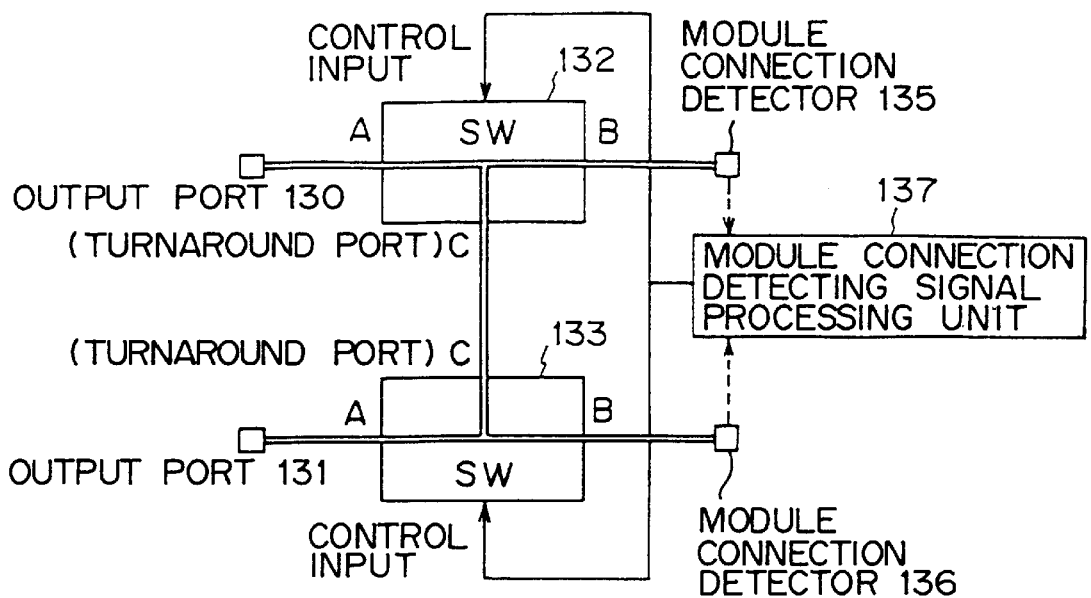
FIGS. 9A and 9B exemplify the structure of an optical switch for use in a unit module of the dispersion-compensator.
Figure 9B:
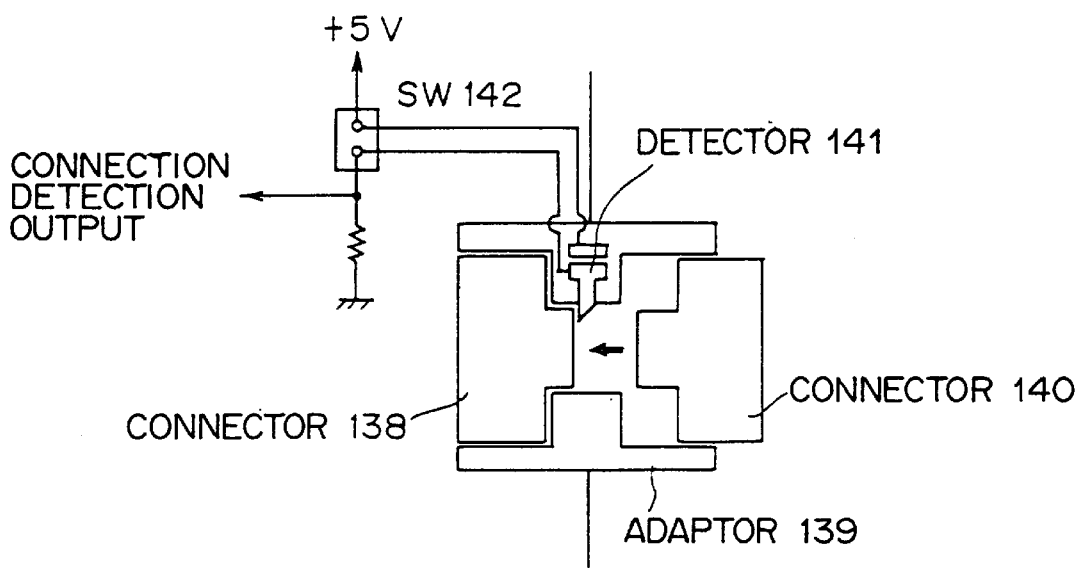

FIGS. 9A and 9B exemplify the structure of an optical switch for use in a module of a dispersion-compensator.

FIG. 9A shows the implementation in which the insertion of a module is detected in the arrangement shown in FIG. 8D. When switches 132 and 133 are closed, an optical path is established between A and C. Light is input to an output port 130, and output from an output port 131. Alternatively in this implementation, light may be input to the output port 131, and output from the output port 130. Dispersion compensation is made in a portion "A" of the optical path. A portion "C" of the optical path is a normal path which does not have a dispersion compensation capability.

When another module is connected, the output and input ports of that module are inserted into module connection detector 135 and 136. The module connection detectors 135 and 136 detect when another module has been connected, and send a signal to a module connection detecting signal processing unit 137. The module connection detecting signal processing unit 137 sends a control signal to the switches 132 and 133 based on this signal. Based on this control signal, the switches 132 and 133 switch the optical path so that light travels through A and B.

The switches 132 and 133 may be of any type as long as they can switch an optical path upon receipt of an electric signal. A mechanical switch is available on the market.

FIG. 9B exemplifies the specific structure of the module connection detector.

The module connection detector is arranged in an adaptor 139 attached to a connector 138 of the module. In FIG. 9B, a nail shaped projecting portion is arranged as a detector 141. When a connector 140, arranged at the output port of another module, is inserted into the adaptor 139, the projecting portion of the detector 141 moves, and electrically connects to and turns on a switch 142, arranged at a different location. Switch 142 generates a connection detection signal. The module connection detecting signal processing unit 137 detects this signal, and switches an optical path within the module.

A dispersion-compensating fiber can be used as the implementation of dispersion compensator. In addition, various other components are available for the dispersion compensator.

Figure 10A:
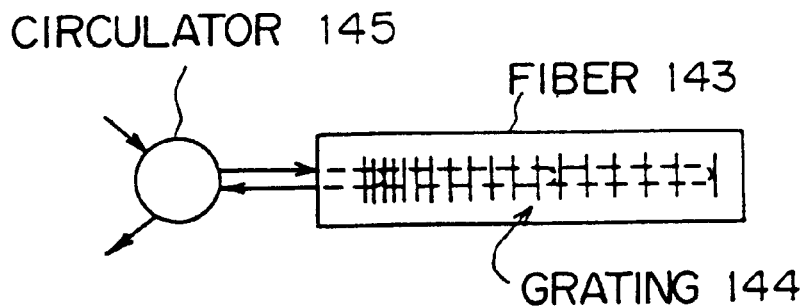
FIGS. 10A through 10C exemplify the structures for compensating dispersion other than a dispersion-compensating fiber.
Figure 10B:
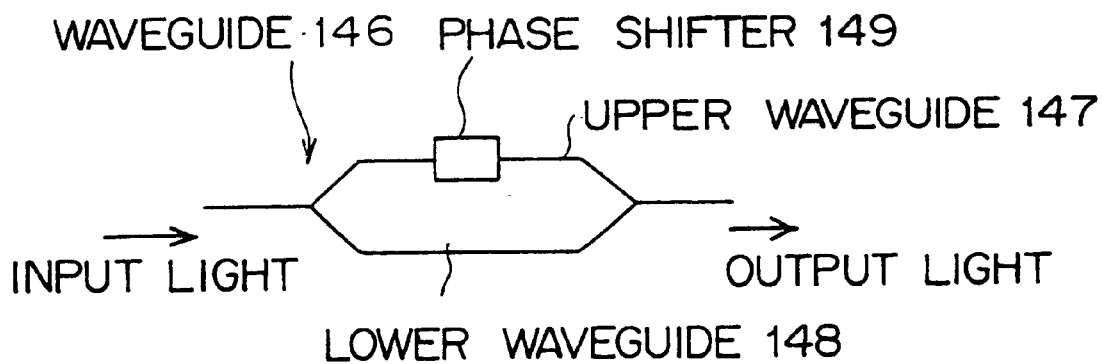
Figure 10C:
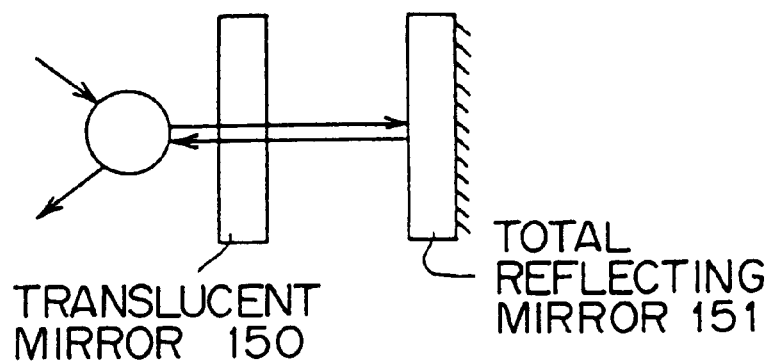

FIGS. 10A through 10C are schematic diagrams showing the implementations of dispersion compensators other than a dispersion-compensating fiber.

FIG. 10A shows a fiber-grating type dispersion-equalizer.

Assume that a grating (a cyclic change of a refractive index) 144 is provided to a fiber 143, and its cycle is changed by degrees. If light is input to the fiber 143, the light is reflected at points which differ depending on wavelength, and returns. After the light, to which a different delay time is provided depending on the wavelength, returns, it is extracted using a circulator 145, and dispersion-equalized. If the directions (side) of the input to the fiber grating is reversed, a dispersion characteristic having an opposite sign can be obtained.

FIG. 10B shows an example of a waveguide type dispersion-equalizer.

A waveguide 146 is formed, for example, using silicon dioxide ($SiO_2$) on an Si substrate, and a phase shifter 149 is arranged so that the phases of an upper waveguide 147 and a lower waveguide 148 differ from each other. The component of an input optical signal on a long wavelength side may propagate along the lower part, while the component on a short wavelength side may propagate along the upper part by means of phase adjustment made by a phase shifter 149. A negative dispersion characteristic can be obtained by making the signal propagate along such a waveguide a number of times. Also a dispersion characteristic of the opposite sign can be obtained by adjusting a phase. A thin film heater may be used as the phase shifter 149.

FIG. 10C shows a resonator type dispersion-equalizer. A total reflecting mirror 151 and a translucent mirror 150 are opposed. If light is input from the translucent mirror 150, only slight having a certain wavelength according to the distance between the mirrors is multiplex-reflected in between, and resonated. Light which is multiplex-reflected a certain number of times proportional to a frequency, and has a frequency in the neighborhood of the resonant wavelength, returns. This light is extracted using a circulator, and a delay time which may differ depending on its frequency (wavelength) is provided and dispersion-equalized. A dispersion characteristic of an opposite direction can be obtained if the light region to be used has a frequency which is either higher or lower than the resonant frequency.

The tolerance of the amount of dispersion compensation which can secure a required transmission characteristic can be improved by chirping an optical signal on a transmitting side as red chirping whose α parameter is positive, arranging a dispersion-compensator in a transmitter, adjusting the amount of dispersion compensation of a dispersion-compensators (in order to compensate the dispersion of a preceding transmission path) in a repeater, and arranging a dispersion-compensator also in a receiver. As a result, the number of required types of devices can be reduced when the types of a dispersion-compensator are set according to a transmission distance.

Furthermore, an optical output can be made higher since the non-linear effect on a transmission path is cancelled by performing the red chirping on the transmitting side.

What is claimed is:

1. An optical transmission system comprising:
   a transmitter to transmit an optical signal while pre-chirping the optical signal such that the value of a chirping parameter a is positive, the transmitter including a negative dispersion compensator, the transmitter producing a signal having a narrowed pulse width, the pulse width being narrowed in accordance with the amount of dispersion compensation and the value of the chirping parameter,
   a plurality of optical amplifiers,
   a receiver, the transmitter, optical amplifiers and the receiver serving as optical components, and
   transmission paths, each connecting two optical components such that each transmission path precedes one optical component,
   the optical amplifiers and the receiver respectively including fixed dispersion compensators, each having an amount of dispersion compensation corresponding to a length of the preceding transmission path.

2. The optical transmission system according to claim 1, wherein the chirping parameter a is set in a range $0 < \alpha \leq 2$.

3. The optical transmission system according to claim 1, wherein the transmitter includes a dispersion-compensator.

4. The optical transmission system according to claim 3, wherein the amount of dispersion compensation of the dispersion-compensator included in the transmitter is set to −1200 ps/nm or less.

5. The optical transmission system according to claim 1, wherein the amount of dispersion compensation of the dispersion-compensators respectively included in the optical amplifiers and the receiver is set to −2300 ps/nm or less.

6. The optical transmission system according to claim 1, wherein said dispersion-compensators are dispersion-compensating fibers.

7. The optical transmission system according to claim 1, wherein the dispersion compensators are grated fibers.

8. The optical transmission system according to claim 1, wherein the dispersion-compensators are waveguide type dispersion-equalizers.

9. The optical transmission system according to claim 1, wherein the dispersion-compensators are resonator type dispersion-equalizers.

10. An optical device for receiving an optical signal over a preceding transmission path from an upstream optical component, the optical signal being transmitted with pre-chirping such that the value of a chirping parameter a is positive, the optical device comprising a repeater having an optical amplifier and at least one fixed amount dispersion compensator with an amount of dispersion compensation corresponding to the length of the preceding transmission path.

11. The optical device according to claim 10, wherein the amount of dispersion compensation of dispersion compensator is set to −2300 ps/nm or less.

12. The optical device according to claim 10, wherein the dispersion-compensator is a dispersion-compensating fiber.

13. The optical device according to claim 10, wherein the dispersion-compensator is a grated fiber.

14. The optical device according to claim 10, wherein the dispersion-compensator is a waveguide type dispersion-equalizer.

15. The optical device according to claim 10, wherein the dispersion-compensator is a resonator type dispersion-equalizer.

16. A method of producing an optical system, comprising the steps of:
   providing for a transmitter, a plurality of optical amplifiers and a receiver, the transmitter, optical amplifiers and receiver serving as optical components, the transmitter transmitting an optical signal while pre-chirping the optical signal;

providing for a plurality of transmission paths, each connecting two optical components such that each transmission path precedes one optical component;

for each of the optical amplifiers and the receiver, determining the length of the preceding transmission path;

providing a plurality of types of fixed dispersion compensators, each type of dispersion compensator having a corresponding range of transmission path lengths; and for each of the optical amplifiers and the receiver, selecting a dispersion compensator corresponding to the length of the preceding transmission path.

17. The method of producing an optical signal according to claim 16, further comprising the step of providing for a dispersion compensator in the transmitter.

18. A method of producing an optical system, comprising the steps of:

providing for a transmitter, a plurality of optical amplifiers and a receiver, the transmitter, optical amplifiers and receiver serving as optical components, the transmitter transmitting an optical signal while pre-chirping the optical signal such that the value of a chirping parameter α is positive;

providing for a plurality of transmission paths, each connecting two optical components such that each transmission path precedes one optical component;

for each of the optical amplifiers and the receiver, determining the length of the preceding transmission path;

providing a plurality of types of fixed dispersion compensators, each type of dispersion compensator having a corresponding range of transmission path lengths; and for each of the optical amplifiers and the receiver, selecting a dispersion compensator corresponding to the length of the preceding transmission path.

19. An optical transmission system comprising:

a transmitter to transmit an optical signal while pre-chirping the optical signal, a plurality of optical amplifiers, a receiver, the transmitter, optical amplifiers and the receiver serving as optical components, and transmission paths, each connecting two optical components such that each transmission path precedes one optical component, the transmitter including a negative dispersion compensator, the transmitter producing a signal having a narrowed pulse width, the pulse width being narrowed in accordance with the amount of dispersion compensation and the value of a chirping parameter, the optical amplifiers and the receiver respectively including at least one fixed amount dispersion compensators, each having an amount of dispersion compensation corresponding to a length of the preceding transmission path.

20. An optical transmission system comprising:

a transmission path arranging between a transmitter and a receiver; and a repeater arranged within the transmission path;

the receiver and the repeater each having a dispersion compensator to compensate for dispersion occurring upstream in the transmitter path, the transmitter increasing a tolerance for an amount of dispersion compensation in the receiver and the repeater by producing a signal having a narrowed pulse width, the narrowing of the pulse width depending on a chirping parameter and a dispersion compensation amount used by the transmitter.

* * * * *